(12) United States Patent
Sabbag et al.

(10) Patent No.: US 9,069,659 B1
(45) Date of Patent: Jun. 30, 2015

(54) READ THRESHOLD DETERMINATION USING REFERENCE READ THRESHOLD

(71) Applicant: DENSBITS TECHNOLOGIES LTD., Haifa (IL)

(72) Inventors: Erez Sabbag, Kiryat Tivon (IL); Hanan Weingarten, Hertzelia (IL); Evgeni Pinkovich, Nesher (IL)

(73) Assignee: DENSBITS TECHNOLOGIES LTD., Haifa (IL)

( * ) Notice: Subject to any disclaimer, the term of this patent is extended or adjusted under 35 U.S.C. 154(b) by 260 days.

(21) Appl. No.: 13/733,774

(22) Filed: Jan. 3, 2013

(51) Int. Cl.
*G06F 12/00* (2006.01)
*G06F 12/02* (2006.01)

(52) U.S. Cl.
CPC .................. *G06F 12/0246* (2013.01)

(58) Field of Classification Search
CPC .................. G06F 12/0246; G06F 2212/2022; G11C 5/147; G11C 29/021
USPC ...................... 711/103; 365/185.33
See application file for complete search history.

(56) References Cited

U.S. PATENT DOCUMENTS

| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Ranjeet et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Bryg et al. |
| 5,729,490 A | 3/1998 | Calligaro et al. |
| 5,740,395 A | 4/1998 | Hasbun et al. |
| 5,745,418 A | 4/1998 | Hu et al. |
| 5,778,430 A | 7/1998 | Giovannetti et al. |
| 5,793,774 A | 8/1998 | Usui et al. |
| 5,920,578 A | 7/1999 | Zook et al. |
| 5,926,409 A | 7/1999 | Engh et al. |
| 5,933,368 A | 8/1999 | Hu et al. |

(Continued)

OTHER PUBLICATIONS

Search Report of PCT Patent Application WO 2009/118720 A3, Mar 4, 2010.

(Continued)

*Primary Examiner* — Jasmine Song
(74) *Attorney, Agent, or Firm* — Dentons US LLP

(57) ABSTRACT

A non-transitory computer readable medium that stores instructions for: reading a first group of flash memory cells using a reference read threshold to obtain multiple read results; processing the multiple read results by performing at least one out of calculating a distribution of values of the multiple read results and counting a number of read results of a certain value; estimating at least one actual read threshold to be used during future read attempts in response to at least one out of (i) the number of read results of the certain value and (ii) distribution information about a distribution of values of the read results; and reading a second group of flash memory cells using the at least one actual read threshold to provide actual read results.

27 Claims, 11 Drawing Sheets

(56) References Cited

U.S. PATENT DOCUMENTS

| | | |
|---|---|---|
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Tsutomu et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Jeong et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |

(56) References Cited

U.S. PATENT DOCUMENTS

| | | |
|---|---|---|
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |
| 2014/0056066 A1* | 2/2014 | Baum et al. ............ 365/185.03 |

OTHER PUBLICATIONS

Search Report of PCT Patent Application WO 2009/095902 A3, Mar 4, 2010.

Search Report of PCT Patent Application WO 2009/078006 A3, Mar 4, 2010.

Search Report of PCT Patent Application WO 2009/074979 A3, Mar 4, 2010.

(56) References Cited

OTHER PUBLICATIONS

Search Report of PCT Patent Application WO 2009/074978 A3, Mar 4, 2010.
Search Report of PCT Patent Application WO 2009/072105 A3, Mar 4, 2010.
Search Report of PCT Patent Application WO 2009/072104 A3, Mar 4, 2010.
Search Report of PCT Patent Application WO 2009/072103 A3, Mar 4, 2010.
Search Report of PCT Patent Application WO 2009/072102 A3, Mar 4, 2010.
Search Report of PCT Patent Application WO 2009/072101 A3, Mar 4, 2010.
Search Report of PCT Patent Application WO 2009/072100 A3, Mar 4, 2010.
Search Report of PCT Patent Application WO 2009/053963 A3, Mar 4, 2010.
Search Report of PCT Patent Application WO 2009/053962 A3, Mar 4, 2010.
Search Report of PCT Patent Application WO 2009/053961 A3, Mar 4, 2010.
Search Report of PCT Patent Application WO 2009/037697 A3, Mar 4, 2010.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com, 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

FIG. 2    200

READ THRESHOLD DETERMINATION USING REFERENCE READ THRESHOLD

BACKGROUND OF THE INVENTION

In a multi-level Flash device the pages are separated by n-levels, corresponding to the number of bits stored per cell. FIG. 1 is a read threshold voltage distribution that demonstrates, for a 3 bits per cell Flash memory, how most significant bit/central significant bit and least significant bit (MSB/CSB/LSB) pages can be read (other mappings are also possible). This figure illustrates eight read threshold distribution lobes 11-18, MSB read threshold 24, two CSB read thresholds 22 and 26 and four LSB read thresholds 21, 23, 25 and 27.

As may be noticed from the figure, for reading an MSB page, only a single read threshold comparison (comparison to MSB read threshold 24) should be performed. For reading a CSB page, two CSB read thresholds 22 and 26 are to be used in order to determine the bit value of every CSB associated cell. For LSB pages the bit-values are determined using the four LSB read thresholds 21, 23, 25 AND 27.

In FIG. 1, the voltage level distributions per level are non-overlapping, however this is only schematic, and in practical cases the distributions may overlap. The reason for overlapping may be intentional for obtaining high programming speed, due to the retention effect, or due to cycling effect.

For floating gate devices, an "old" page, may introduce greater overlap between lobes than a new page, since after many program/erase (P/E) cycles there is accumulated trap charge, which is de-trapped over time. After a long duration, every lobe may have a larger standard deviation (std) and may have a different mean location. These affects are also known as retention. These are just two examples for overlapping distributions. There may be many more, such as read disturbs, or programming disturbs, etc.

As an example, we may consider a NAND FLASH array. The NAND FLASH array includes rows and columns (strings). During a read operation, an entire row/page is read from the NAND FLASH array. This is done by applying a bias voltage (or pass voltage) to all rows not being read and a reference read threshold voltage to the row we wish to read. Per each column of the NAND flash memory array one flash memory cell is read (the flash memory cell that belongs to the selected row) while the other flash memory cells are "open" due to the provision of the bias voltage.

The bias voltage allows the FLASH transistors to fully conduct. The cells lying on the row being read will conduct only if the read threshold voltage is sufficiently high to overcome the trapped change in the floating gate. At the bottom of each string there is a comparator which measures the current and outputs either a "1" or a "0" depending whether the current through that string passed a certain read threshold.

An MSB page is read by setting the MSB read threshold 24 between the fourth and fifth lobes 144 and 15. All lobes above the MSB read threshold 24 (lobes 15-18) will be read as "0"s and all lobes below that MSB read threshold 24 (lobes 11-14) will be read as "1"s.

As mentioned above, to read a CSB page two CSB read threshold 22 and 26 are used. Lobes 11 and 12 that are bellow the first CSB read threshold 22 and lobes 17 and 18 that are above the second CSB read threshold 26 will be read as "1"s. Lobes 13-16 that are between the two CSB read thresholds 22 and 26 will be read as "0"s. Similarly, the LSB pages are read by applying the four LSB read thresholds so that lobes 11, 14, 15 and 18 will be read as "1" and lobes 12-13 and 16-17 will be read as "1".

It is noted that each lobe represents a set of MSB, CSB and LSB read values. Each flash memory cell of the 3 bpc flash memory cell stores such a set of values.

Those of skill in the art will appreciate that following retention, the positions of the lobes shift and they become wider. If during a read operation the same detection levels are used as just following programming, it is most likely that a considerable amount of read errors would occur. To overcome this problem, the read thresholds are modified as the block ages in order to minimize the number of read errors.

There is a growing need to find actual read thresholds to be applied during actual read attempts that will reduce the amount of read errors.

SUMMARY

Various embodiments of the invention include a computer readable medium that is non-transitory and may store instructions for performing various stages.

According to an embodiment of the invention there may be provided a non-transitory computer readable medium that stores instructions for: reading a first group of flash memory cells using a reference read threshold to obtain multiple read results; processing the multiple read results by performing at least one out of calculating a distribution of values of the multiple read results and counting a number of read results of a certain value; estimating at least one actual read threshold to be used during future read attempts in response to at least one out of (i) the number of read results of the certain value and (ii) distribution information about a distribution of values of the read results; and reading a second group of flash memory cells using the at least one actual read threshold to provide actual read results.

The non-transitory computer readable medium may store instructions for processing the multiple read results by calculating the distribution of values of the read results.

The non-transitory computer readable medium may store instructions for processing the multiple read results by counting the number of read results of the certain value.

The non-transitory computer readable medium may store instructions for estimating the at least one actual read threshold by applying an estimation function on at least one of (i) the number of read results of the certain value and (ii) distribution information about the distribution of values of the read results The estimation function may be a linear function.

The estimation function may be a polynomial function.

The estimation function may be a minimum means square estimating function.

The non-transitory computer readable medium may store instructions for updating the estimation function in response to the actual read results.

The non-transitory computer readable medium may store instructions for performing an initial read of an initial group of flash memory cells to obtain initial read results; and selecting the reference read threshold in response to the initial read results.

The non-transitory computer readable medium may store instructions for evaluating a state of the initial group of flash memory cells in response to the initial read results; wherein the selecting of the reference read threshold is responsive to the state of the initial group of flash memory cells.

The non-transitory computer readable medium may store instructions for performing an initial read of an initial group of flash memory cells to obtain initial read results; processing the initial read results by performing at least one out of calculating a distribution of values of the initial read results and counting a number of initial read results of a certain value; and selecting the reference read threshold in response to at least one out of the distribution of values of the initial read results and the number of initial read results of the certain value.

The non-transitory computer readable medium may store instructions for selecting the reference read threshold based upon a physical characteristic of the first group of memory cells.

The physical characteristic may represent a location of the first group of flash memory cells.

The physical characteristic may represent a state of the first group of flash memory cells.

The non-transitory computer readable medium may store instructions for calculating the reference read threshold.

The non-transitory computer readable medium may store instructions for calculating the reference read threshold in response to information about read threshold voltages of a plurality of flash memory cells and about logical values stored by the plurality of flash memory cells.

The non-transitory computer readable medium may store instructions for calculating the reference read threshold by obtaining information about read threshold voltages of a plurality of flash memory cells and about logical values stored by the plurality of flash memory cells; and finding, in response to the information, the reference read threshold that when used during read attempts, minimizes a number of read errors.

The non-transitory computer readable medium may store instructions for reading the first group of flash memory cells using multiple reference read thresholds to obtain the multiple read results.

According to an embodiment of the invention there may be provided a non-transitory computer readable medium may store instructions for reading a first group of flash memory cells using a plurality of reference read thresholds to obtain a plurality of sets of read results, one set of read results per each flash memory cell of the first group of flash memory cells; processing the plurality of sets of read results by performing at least one out of calculating a distribution of values of the plurality of sets of read results and counting a number of sets of read results of a given value; estimating at least one actual read threshold to be used during future read attempts in response to at least one of the distribution of values of the plurality of sets of read results and the number of sets of read results of the given value.

According to an embodiment of the invention there may be provided a non-transitory computer readable medium that may store instructions for acquiring information about read threshold voltages of a plurality of flash memory cells and about logical values stored by the plurality of flash memory cells; selecting, calculating or finding a reference read threshold per one or more groups of flash memory cells; calculating, based upon the information about read threshold voltages of a plurality of flash memory cells and about logical values stored by the plurality of flash memory cells, and for each group of flash memory cells out of the plurality of flash memory cells, one or more suggested read thresholds; reading the flash memory cells of different groups, using the reference read threshold associated with each group, to provide read results; counting, for each group of flash memory cells of the plurality of flash memory cells, a number of read results of a certain value; and finding, per each suggested read threshold, an estimating function that will map the numbers of read result of the certain value per each group to the suggested read threshold.

Additional embodiments of the invention provide a method that may include performing any stages that are preformed by a computerized system that executed the instructions stored in any of the computer readable medium described in the specification and/or claimed in the claims.

According to an embodiment of the invention there may be provided a method that may include reading a first group of flash memory cells using a reference read threshold to obtain multiple read results; processing the multiple read results by performing at least one out of calculating a distribution of values of the multiple read results and counting a number of read results of a certain value; estimating at least one actual read threshold to be used during future read attempts in response to at least one out of (i) the number of read results of the certain value and (ii) distribution information about a distribution of values of the read results; and reading a second group of flash memory cells using the at least one actual read threshold to provide actual read results.

The method may include processing the multiple read results by calculating the distribution of values of the read results.

The method may include processing the multiple read results by counting the number of read results of the certain value.

The method may include estimating the at least one actual read threshold by applying an estimation function on at least one of (i) the number of read results of the certain value and (ii) distribution information about the distribution of values of the read results The estimation function may be a linear function.

The estimation function may be a polynomial function.

The estimation function may be a minimum means square estimating function.

The method may include updating the estimation function in response to the actual read results.

The method may include performing an initial read of an initial group of flash memory cells to obtain initial read results; and selecting the reference read threshold in response to the initial read results.

The method may include evaluating a state of the initial group of flash memory cells in response to the initial read results; wherein the selecting of the reference read threshold is responsive to the state of the initial group of flash memory cells.

The method may include performing an initial read of an initial group of flash memory cells to obtain initial read results; processing the initial read results by performing at least one out of calculating a distribution of values of the initial read results and counting a number of initial read results of a certain value; and selecting the reference read threshold in response to at least one out of the distribution of values of the initial read results and the number of initial read results of the certain value.

The method may include selecting the reference read threshold based upon a physical characteristic of the first group of memory cells.

The physical characteristic may represent a location of the first group of flash memory cells.

The physical characteristic may represent a state of the first group of flash memory cells.

The method may include calculating the reference read threshold.

The method may include calculating the reference read threshold in response to information about read threshold voltages of a plurality of flash memory cells and about logical values stored by the plurality of flash memory cells.

The method may include calculating the reference read threshold by obtaining information about read threshold voltages of a plurality of flash memory cells and about logical values stored by the plurality of flash memory cells; and finding, in response to the information, the reference read threshold that when used during read attempts, minimizes a number of read errors.

The method may include reading the first group of flash memory cells using multiple reference read thresholds to obtain the multiple read results.

According to an embodiment of the invention there may be provided a method that may include reading a first group of flash memory cells using a plurality of reference read thresholds to obtain a plurality of sets of read results, one set of read results per each flash memory cell of the first group of flash memory cells; processing the plurality of sets of read results by performing at least one out of calculating a distribution of values of the plurality of sets of read results and counting a number of sets of read results of a given value; estimating at least one actual read threshold to be used during future read attempts in response to at least one of the distribution of values of the plurality of sets of read results and the number of sets of read results of the given value.

According to an embodiment of the invention there may be provided a method that may include acquiring information about read threshold voltages of a plurality of flash memory cells and about logical values stored by the plurality of flash memory cells; selecting, calculating or finding a reference read threshold per one or more groups of flash memory cells; calculating, based upon the information about read threshold voltages of a plurality of flash memory cells and about logical values stored by the plurality of flash memory cells, and for each group of flash memory cells out of the plurality of flash memory cells, one or more suggested read thresholds; reading the flash memory cells of different groups, using the reference read threshold associated with each group, to provide read results; counting, for each group of flash memory cells of the plurality of flash memory cells, a number of read results of a certain value; and finding, per each suggested read threshold, an estimating function that will map the numbers of read result of the certain value per each group to the suggested read threshold.

Additional embodiments of the invention include a system arranged to execute any or all of the methods described in the specificaiton and/or claims, including any stages- and any combinations of same.

According to an embodiment of the invention there may be provided a system that may be arranged to: read a first group of flash memory cells using a reference read threshold to obtain multiple read results; process the multiple read results by performing at least one out of calculate a distribution of values of the multiple read results and counting a number of read results of a certain value; estimate at least one actual read threshold to be used during future read attempts in response to at least one out of (i) the number of read results of the certain value and (ii) distribution information about a distribution of values of the read results; and read a second group of flash memory cells using the at least one actual read threshold to provide actual read results.

The system may be arranged to process the multiple read results by calculate the distribution of values of the read results.

The system may be arranged to process the multiple read results by counting the number of read results of the certain value.

The system may be arranged to estimate the at least one actual read threshold by applying an estimating function on at least one of (i) the number of read results of the certain value and (ii) distribution information about the distribution of values of the read results The estimating function may be a linear function.

The estimating function may be a polynomial function.

The estimating function may be a minimum means square estimating function.

The system may be arranged to update the estimating function in response to the actual read results.

The system may be arranged to perform an initial read of an initial group of flash memory cells to obtain initial read results; and select the reference read threshold in response to the initial read results.

The system may be arranged to evaluate a state of the initial group of flash memory cells in response to the initial read results; wherein the selection of the reference read threshold is responsive to the state of the initial group of flash memory cells.

The system may be arranged to perform an initial read of an initial group of flash memory cells to obtain initial read results; process the initial read results by performing at least one out of calculate a distribution of values of the initial read results and counting a number of initial read results of a certain value; and select the reference read threshold in response to at least one out of the distribution of values of the initial read results and the number of initial read results of the certain value.

The system may be arranged to select the reference read threshold based upon a physical characteristic of the first group of memory cells.

The physical characteristic may represent a location of the first group of flash memory cells.

The physical characteristic may represent a state of the first group of flash memory cells.

The system may be arranged to calculate the reference read threshold.

The system may be arranged to calculate the reference read threshold in response to information about read threshold voltages of a plurality of flash memory cells and about logical values stored by the plurality of flash memory cells.

The system may be arranged to calculate the reference read threshold by obtaining information about read threshold voltages of a plurality of flash memory cells and about logical values stored by the plurality of flash memory cells; and find, in response to the information, the reference read threshold that when used during read attempts, minimizes a number of read errors.

The system may be arranged to read the first group of flash memory cells using multiple reference read thresholds to obtain the multiple read results.

According to an embodiment of the invention there may be provided a system that may be arranged to read a first group of flash memory cells using a plurality of reference read thresholds to obtain a plurality of sets of read results, one set of read results per each flash memory cell of the first group of flash memory cells; process the plurality of sets of read results by performing at least one out of calculate a distribution of values of the plurality of sets of read results and counting a number of sets of read results of a given value; estimate at least one actual read threshold to be used during future read attempts in response to at least one of the distribution of values of the plurality of sets of read results and the number of sets of read results of the given value.

According to an embodiment of the invention there may be provided a system that may be arranged to acquire information about read threshold voltages of a plurality of flash memory cells and about logical values stored by the plurality of flash memory cells; select, calculate or find a reference read threshold per one or more groups of flash memory cells; calculate, based upon the information about read threshold voltages of a plurality of flash memory cells and about logical values stored by the plurality of flash memory cells, and for each group of flash memory cells out of the plurality of flash memory cells, one or more suggested read thresholds; read the flash memory cells of different groups, using the reference read threshold associated with each group, to provide read results; count, for each group of flash memory cells of the plurality of flash memory cells, a number of read results of a certain value; and find, per each suggested read threshold, an estimating function that will map the numbers of read result of the certain value per each group to the suggested read threshold.

According to an embodiment of the invention there may be provided a system, that may include a flash memory controller that is arranged to read a first group of flash memory cells using a reference read threshold to obtain multiple read results; and a host computer that is arranged to: process the multiple read results by performing at least one out of calculating a distribution of values of the multiple read results and counting a number of read results of a certain value; and estimate at least one actual read threshold to be used during future read attempts in response to at least one out of (i) the number of read results of the certain value and (ii) distribution information about a distribution of values of the read results. Wherein the flash memory controller is also arranged to read a second group of flash memory cells using the at least one actual read threshold to provide actual read results.

There may be provided a system that may include a flash memory controller that is arranged to: read a first group of flash memory cells using a reference read threshold to obtain multiple read results; process the multiple read results by performing at least one out of calculating a distribution of values of the multiple read results and counting a number of read results of a certain value; estimate at least one actual read threshold to be used during future read attempts in response to at least one out of (i) the number of read results of the certain value and (ii) distribution information about a distribution of values of the read results; and read a second group of flash memory cells using the at least one actual read threshold to provide actual read results.

There may be provided a system that may include a flash memory controller that is arranged to read a first group of flash memory cells using a plurality of reference read thresholds to obtain a plurality of sets of read results, one set of read results per each flash memory cell of the first group of flash memory cells; and a host computer that is arranged to process the plurality of sets of read results by performing at least one out of: calculating a distribution of values of the plurality of sets of read results and counting a number of sets of read results of a given value; and estimate at least one actual read threshold to be used during future read attempts in response to at least one of the distribution of values of the plurality of sets of read results and the number of sets of read results of the given value.

There may be provided a system that may include a flash memory controller that is arranged to read a first group of flash memory cells using a plurality of reference read thresholds to obtain a plurality of sets of read results, one set of read results per each flash memory cell of the first group of flash memory cells; to process the plurality of sets of read results by performing at least one out of: calculating a distribution of values of the plurality of sets of read results and counting a number of sets of read results of a given value; and estimate at least one actual read threshold to be used during future read attempts in response to at least one of the distribution of values of the plurality of sets of read results and the number of sets of read results of the given value.

There may be provided a system that may include a flash memory controller that is arranged to acquire information about read threshold voltages of a plurality of flash memory cells and about logical values stored by the plurality of flash memory cells; select, calculate or find a reference read threshold per one or more groups of flash memory cells; calculate, based upon the information about read threshold voltages of a plurality of flash memory cells and about logical values stored by the plurality of flash memory cells, and for each group of flash memory cells out of the plurality of flash memory cells, one or more suggested read thresholds; read the flash memory cells of different groups, using the reference read threshold associated with each group, to provide read results; count, for each group of flash memory cells of the plurality of flash memory cells, a number of read results of a certain value; and find, per each suggested read threshold, an estimating function that will map the numbers of read result of the certain value per each group to the suggested read threshold.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
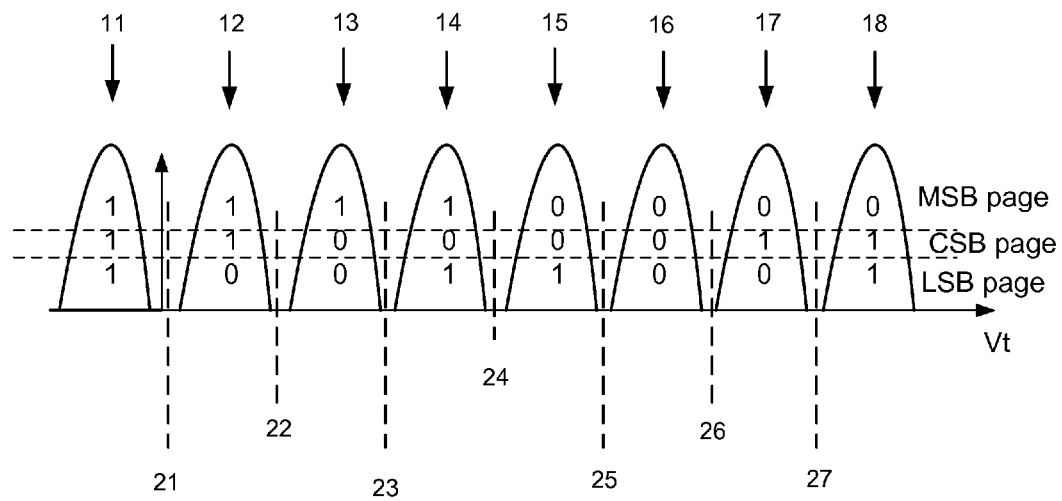
FIG. 1 illustrates a prior art read threshold voltage distribution.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that can be executed by the system and should be applied mutatis mutandis to a non-transitory computer readable medium that stores instructions that can be executed by the system.

Any reference in the specification to a non-transitory computer readable medium should be applied mutatis mutandis to a system capable of executing the instructions stored in the non-transitory computer readable medium and should be applied mutatis mutandis to method that can be executed by a computer that reads the instructions stored in the non-transitory computer readable medium.

The phrase "reference read threshold" means a read threshold that is applied during one or more reference read attempts that are dedicated for finding one or more actual read thresholds.

The phrase "actual read threshold" means a read threshold that is used during one or more normal read attempt. A normal read attempt is a read attempts that is not dedicated only for finding the actual read threshold. An actual read threshold can be an optimal read threshold or a sub-optimal read threshold in the sense of minimizing read errors. The following text may refer to the actual read threshold as an optimal read threshold but it should be noted that any reference to an optimal read can be also be viewed as a reference to a sub-optimal read threshold.

It is noted that the methods, systems and non-transitory computer readable media can be applied when the ordering of the lobes are as illustrated in FIG. 1. It is noted that that the methods, systems and non-transitory computer readable media can be applied when the ordering (assignment of logical values to read threshold lobes) differs from those illustrated in FIG. 1. For example, the reading process of a page may include more than one threshold for all read types.

According to various embodiments of the invention there are provided methods, computer readable media and systems that may use reference read thresholds during reference read attempts to provide read results that are processed to provide optimal read thresholds. The processing may include applying an estimation function to find the optimal read thresholds.

The optimal read thresholds can be learnt based upon a limited amount of measurements (read results) available. When a need to re-acquire a read threshold arises, a small amount of measurements (e.g. performing a single or a small number of reference read attempts) and based on the results of these measurements the optimal read thresholds can be estimated.

Training Process

According to various embodiments of the invention a training process may be provided and may include calculating functions that can be used to calculate actual read thresholds.

If, for example, actual read thresholds are calculates based upon the distribution of values of the read results then the training process may be aimed to find an estimation function that will try to find an actual read threshold (that may be an optimal read threshold) as a function of the distribution of values of the read results. Thus—information about the distribution (at least information about two or more values of read results) can be used to estimate actual read results.

Training Process Based Upon Number of "1"s

Figure 2:
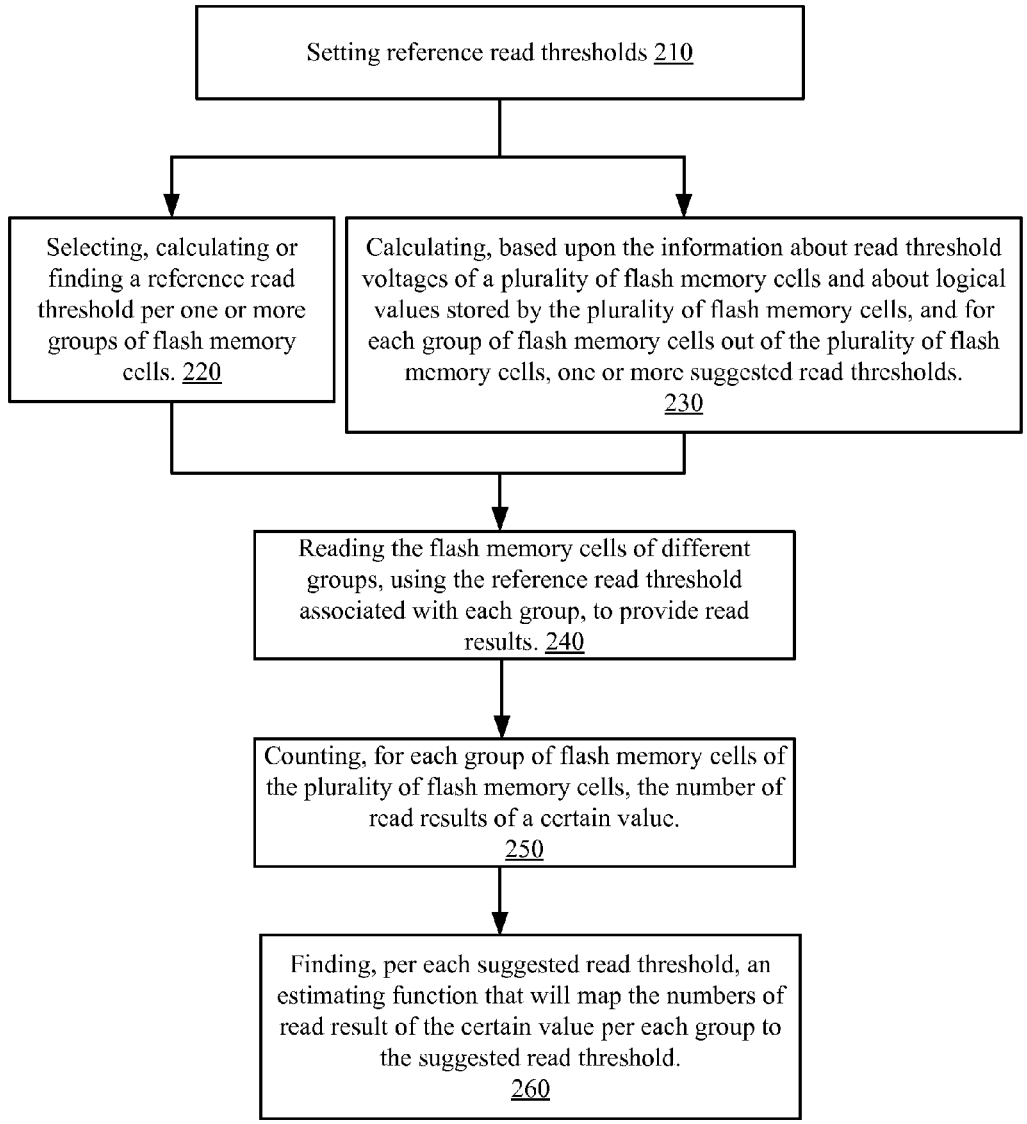
FIG. 2 illustrates a training process according to an embodiment of the invention.

FIG. 2 illustrates a training process 200 according to an embodiment of the invention. This training process is used to build a data base which then, in turn, allows us to find an estimation function that estimated the "optimal" read thresholds corresponding to available reference read information.

For simplicity of explanation it is assumed that a single reference read threshold is found per one or more groups of flash memory cells and it is used for estimating actual read thresholds.

If, for example, actual read thresholds are calculated based upon the number of read results of the certain value (for example "1") then the training process aimed to find an estimation function that will try to find an actual read threshold (that may be an optimal read threshold) as a function of the number of read results of the certain value. The following explanation will refer, for simplicity of explanation to the latter case (number of "1").

The training process may start by stage 210 of acquiring information about read threshold voltages of a plurality of flash memory cells and about logical values stored by the plurality of flash memory cells. The number of these plurality of flash memory cells can be very large (exceed $10^{\wedge}q$, wherein q may exceed 3) and may be large enough to assure that the number of is will be 50% or any predetermined amount—regardless of the exact content of information stores in these plurality of flash memory cells. Alternatively, the plurality of flash memory cells can be read while knowing the expected content of these flash memory cells.

The exact value of the cells should be know in order to be able to calculate the read threshold values. In addition, it may be assumed that the probability of '1' is 50%.

This information can be stored in a database or any other data structure. The acquisition may include generating the database, updating the database or merely retrieving the information from the database.

The plurality of flash memory cells can include flash be taken from different locations (different rows, different erase blocks, different memory banks, different flash memory dies and even different flash memory devices).

The plurality (N) of flash memory cells may include flash memory cells that differ from each other by state (different wear levels, different program erase P/E cycle count, different retention times, and the like). The retention can be emulated or obtained by baking different flash memory cells.

The plurality of flash memory cells can include flash memory cells of different locations and state.

Figure 3:
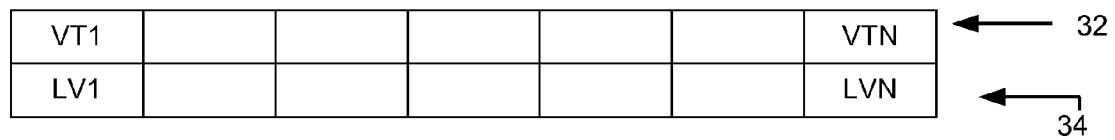
FIG. 3 illustrates a database according to an embodiment of the invention.

FIG. 3 illustrates a database 30 according to an embodiment of the invention.

Database 30 includes values (32) of the threshold voltage of each flash memory cell of the plurality of flash memory cells—such as VT1-VTN, and the logical value (34) that should be stored in each one of these N flash memory cells. The logical values are denoted LV1-LVN.

The training process can find actual read thresholds based upon the entire database or portions thereof. Thus—one or more reference read thresholds can be found per the entire database or per one or more portions of the database. For example—one or more reference read thresholds can be selected per a group of rows, per a range of P/E cycle count, per an erase block, per a die, per a combination of P/E cycle count and erase block, and the like.

Flash memory cells that share the same reference read threshold and the same suggested read thresholds are referred to a set of flash memory cells. A set may include one or more groups of flash memory cells.

Figure 4:
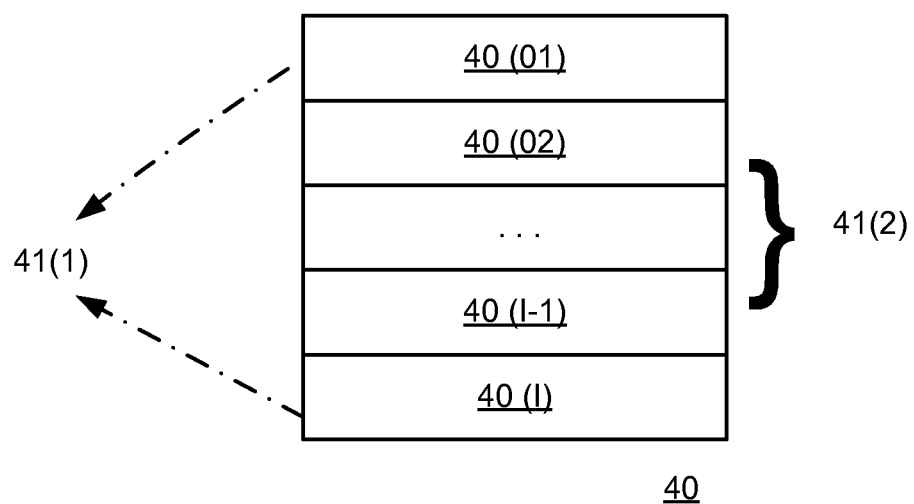
FIG. 4 illustrates multiple groups of flash memory cells that belong to two sets of flash memory cells according to an embodiment of the invention.

FIG. 4 illustrates multiple (I) groups of flash memory cells 40(1)-40(I), wherein these groups belong to two sets—set 41(1) that includes flash memory groups 40(1) and 40(I) while all other groups 40(2)-40(I−1) belong to flash memory set 41(2).

Referring back to FIG. 2—stage 210 may be followed by stage 220 of selecting, calculating or finding a reference read threshold per one or more groups of flash memory cells. Referring to the example set forth in FIG. 3—the training process should find a first reference read threshold for set 41(1) and a second reference read threshold for set 41(2). A group of flash memory cells may be a page of flash memory cells or any other group of flash memory cells that may be adjacent to each other.

Stage 220 may include spanning the possible reference read threshold values until finding the read reference value that complies with a criterion such as a minimal amount of read errors is detected. It is noted that other optimal criteria can be provided and that sub-optimal criteria can also be defined for finding the read threshold.

Each logical value should be associated with a range of threshold voltages (such as a threshold voltage lobe) that should be delimited by one or more read thresholds. Comparing the exact voltage threshold of each flash memory cell to a range of threshold voltages that should be associated with that the logical value can indicate whether that flash memory cell is expected to cause a read error or not.

The information can be obtained by performing multiple read attempts of the plurality of flash memory cells with different read thresholds that scan the range of voltage thresholds of the flash memory cells. A voltage threshold scan (VT scan) can generate the voltage threshold distribution illustrated in FIG. 1 as well as an indication which flash memory cells belong to each value of threshold voltage.

Each reference read threshold may be calculated to comply with a criterion such as minimizing the number of read errors.

Stage 210 may also be followed by stage 230 of calculating, based upon the information about read threshold voltages of a plurality of flash memory cells and about logical values stored by the plurality of flash memory cells, and for each group of flash memory cells out of the plurality of flash memory cells, one or more suggested read thresholds. The suggested read thresholds can be optimal or sub-optimal read thresholds.

Stage 220 and 230 may be followed by stage 240 of reading the flash memory cells of different groups, using the reference read threshold associated with each group, to provide read results. As indicated above—one or more groups may form a set and each flash memory cell in the set will be read using the same one or more reference read thresholds to be used when reading other flash memory cells of the set.

Stage 240 may be followed by stage 250 of counting, for each group of flash memory cells of the plurality of flash memory cells, the number of read results of a certain value.

Figure 5:
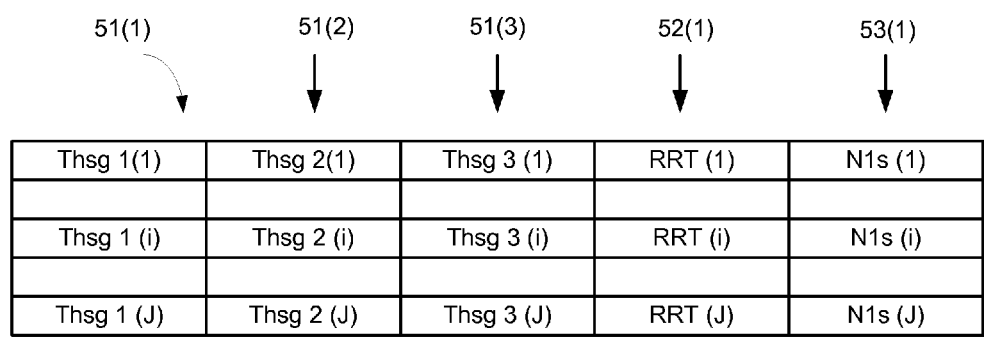
FIG. 5 illustrates a data structure according to an embodiment of the invention.

FIG. 5 illustrates a data structure 50 according to an embodiment of the invention.

Data structure 50 of FIG. 5 is a table although other forms of data structures can be provided.

It is assumed that the flash memory cells are 2 bpc flash memory cells (thus there are 3 suggested read thresholds, that there are J different groups of flash memory cells, and that a single reference read threshold is associated with each group.

Each row of data structure 50 is associated with a single group of flash memory cells.

Columns 51(1)-51(3) store the three suggested read thresholds (Thsg1(i)-Thsg3(i)), column 52(1) stores the reference read threshold (RRT(i)) and column 53(1) stores the number (N1s(i)) of read results of value "1" obtained when applying the reference read threshold of column 52(1). Index i ranges between 1 and I.

Column 1 stores Thsg1

It is noted that multiple columns can be allocated with different values of reference read thresholds applied to the same group of flash memory cells and multiple columns can be allocated for storing the number of read results of value "1" obtained when applying these reference read results.

Referring back to FIG. 2—stage 250 is followed by stage 260 of finding, per each suggested read threshold, an estimating function that will map the numbers of read result of the certain value per each group to the suggested read threshold.

The estimating functions of different suggested read thresholds may differ from each other.

The estimation function can be any function that provides such a mapping. It may be, for example, a linear function, a polynomial function, a minimum mean square error function and the like or even a function in a form of a table.

The mapping function will be used to set actual read thresholds. When, for example an actual read threshold of a group of flash memory cells should be read—the group of flash memory cells is read using a reference read threshold associated with that group to provide read results, and the number of read results of a certain value is fed to one or more mapping functions to determine one or more actual read thresholds to be used in future read attempts of the group of flash memory cells.

Linear Estimating Function

The actual read threshold is calculated by applying an estimating function of:

$$\text{actual read threshold} = a1 * N1s + a0.$$

Where a1 and a0 are learnt during the training process.

Coefficients a1 and a0 can be selected such as to minimize the following error function:

Error function=sum,taken over all samples($k$ ranges between $l$ and Nsamples) of $|a1*N1s(k)+a0-Thsg(k)|^r$;

where r is a given natural number

Wherein:
a. Nsamples is the number of flash memory cells that should share the same reference read threshold; these flash memory cells may form one or more group of flash memory cells and they are referred to as a set of flash memory cells b. N1s(k) is the number of read results of value "1" out of the read results of the set of flash memory cells;

c. Thsg(k) is a suggested read threshold of the database for the set of flash memory cells; and d. /\ represent the power operation.

e. || represents an absolute value operation.

The above process is repeated for all sets of flash memory cells and the selected read threshold may be the one for which the optimal choice of a1 and a0 minimizes the error function.

A Polynomial Estimating Function.

The actual read threshold is calculated by applying an estimating function of: Actual read threshold=sum, over index i of ai multiplied by N1s by the power of i.

Coefficients ai can be determined during the training process. They may be selected to minimize an error function which equals a first sum, taken over all samples (k ranges between 1 and Nsamples) of |a second sum of ai*N1s(k)/\i–Thsg(k)|/\r, where r is a natural number.

A Minimum Means Square Estimating Function

According to an embodiment of the invention the estimating function can be a minimum means square error estimating function.

Estimating Functions Per Sub-Ranges of Number of Read Results Having a Certain Value The full range of possible N1s can be split to multiple sub-ranges and an estimating function can be determined per sub-range.

The range of values that N1s can take can be divided into sub-ranges rj, wherein index j ranges between 1 and J.

According to an embodiment of the invention for each sub-range rj a suggested "optimal" read threshold may equal the average of Thsg(k) values for this sub-range and may be equal to the average of Nis in this sub-range.

The choice of the reference read threshold per sub-range can be selected such as to minimize the following error function: $Err_{sample\ Threshold} = \Sigma_{k=1}^{Nsamples} |Th_i(N_{1s}) - Th_{opt}^k|^2$.

This error function (which should be minimized when finding read thresholds) slightly differs from the previous error functions—as it is applied only on flash memory cell rows which when read with a given reference th, gives roughlty a same number of ones (i.e., the number of ones falls in the rj range). This is done for each range.

Other error functions may be selected, for example, based on absolute difference values instead of the squared distances.

Single Reference Read Attempt

There may be provided a method for reading a certain amount of data from a designated reference page in a row in a block (in a Flash devices), counting the numbers of read results set to one (or to zero) and based on that number, estimating the optimal or sub-optimal position of the read thresholds.

It is noted that the number of reference read thresholds allocated per a group of flash memory cells can differ from the number of bits stored within each of the flash memory cells. For example, a single reference read threshold can be associated with a 3-bpc flash memory cells. It is expected that the number of reference read thresholds per a group of flash memory cells will not exceed the number of bit per cell of these flash memory cell. Thus, up till three reference read thresholds will be allocated for a group of 3 bpc flash memory cells. Each, reference read may be used to estimate the thresholds of different bit type page in the row.

Figure 6:
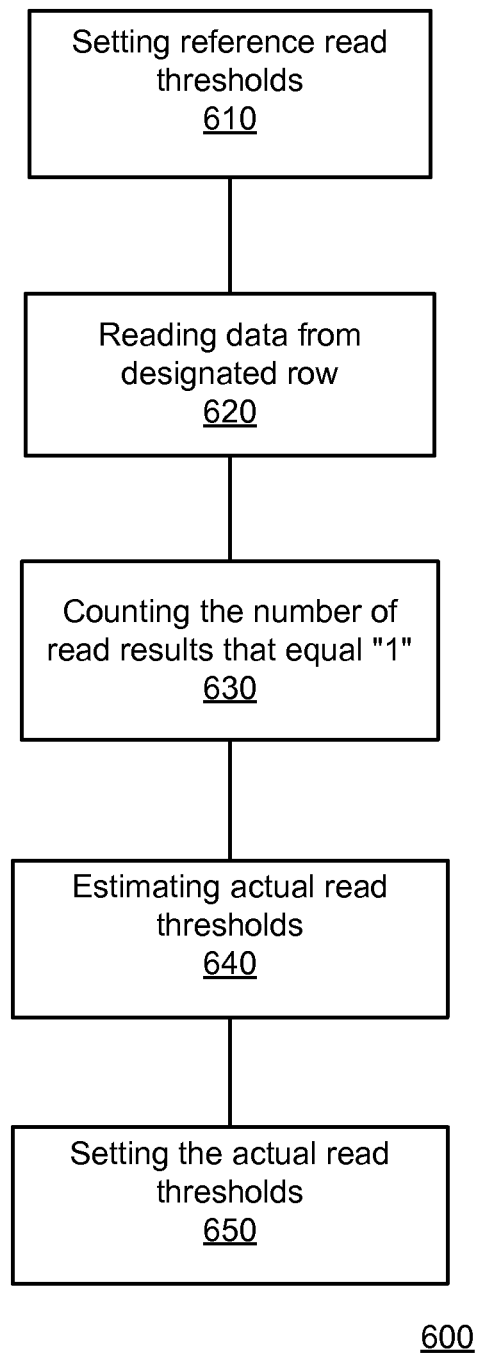
FIG. 6 illustrates a method according to an embodiment of the invention.

FIG. 6 illustrates method 600 according to an embodiment of the invention.

Method 600 may start by stage 610 of setting reference read thresholds. Prior to performing a reference read which will obtain the required measurable data for the estimation, the read thresholds should be set to their predefined reference value. This assures that we always perform the estimation based on a consistent measurement set.

Stage 610 may be followed by stage 620 of reading data from designated row (in designated block and die). At this stage, a page (or part of it) is read from the row for which we wish to optimize the read thresholds.

Stage 620 may be followed by stage 630 of counting the number of read results that equal "1". Based on the number of "1" in the binary representation of the data we can perform an estimation of the actual read thresholds.

Stage 630 may be followed by stage 640 of estimating actual read thresholds. It may include applying an estimating function on N1s to find each actual read threshold.

Stage 640 may be followed by stage 650 of setting the actual read thresholds to the values calculated in stage 640.

Stage 640 of estimating the optimal read thresholds may be responsive to (a) an estimating function that maps the Nls (number of "1" counted in stage 630) and (b) an actual read threshold value.

Figure 7:
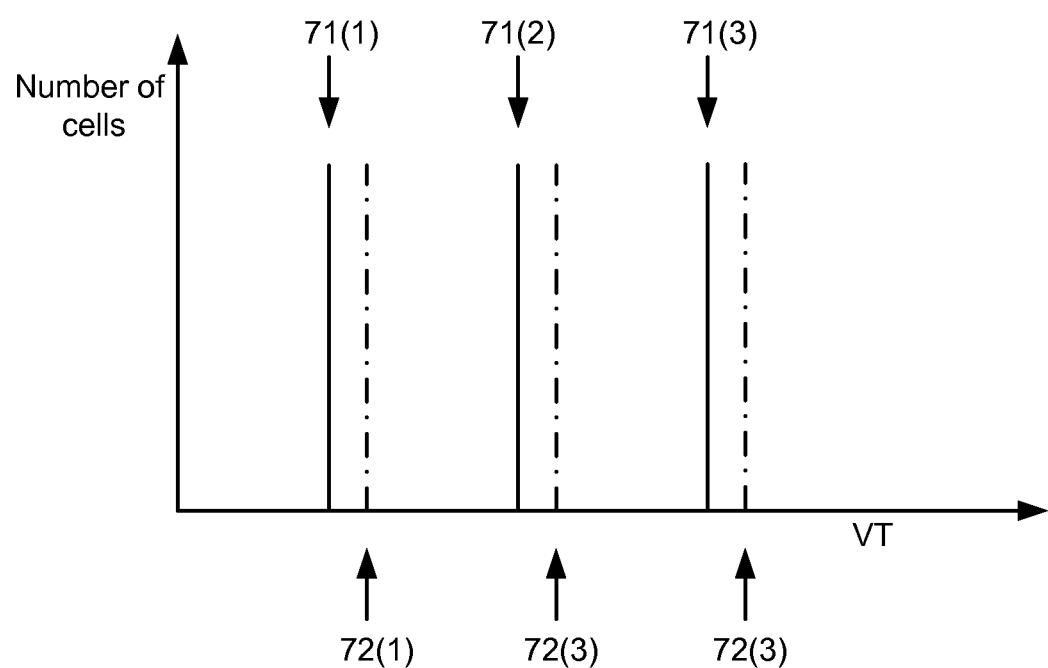
FIG. 7 illustrates first and second sets of actual read thresholds according to an embodiment of the invention.

FIG. 7 illustrates first and second sets of actual read thresholds according to an embodiment of the invention.

The first set of actual read thresholds includes first actual read thresholds 71(1)-71(3) and the second set of actual read thresholds includes second actual read thresholds 72(1)-72(3). These sets differ from each other and were obtained by applying the same estimating function on two different values of N1s.

Multiple Reference Reads Attempts

In some cases, more accurate read threshold estimations may be obtained if the estimation of the actual read thresholds is based on several read measurements. For example, if a flash memory device suffers both from retention and from read disturb, there will be seen two contradictory behaviors which affect different optimal read thresholds. In this case, most actual read thresholds will tend to be lower than the original values, just after programming. However, the first read threshold may be higher due to the read disturb. In order to sense both the read disturb and retention phenomenon, it may be required to perform two or more read attempts using two or more reference read thresholds.

If, for example, a single read attempt provide read results that represent a comparison between two reference read thresholds it may not be clear if the number of is in the read result are due to the first or second reference read threshold.

Reading more than one reference read may allow us to distinguish between the effects of each read threshold comparison.

Figure 8:
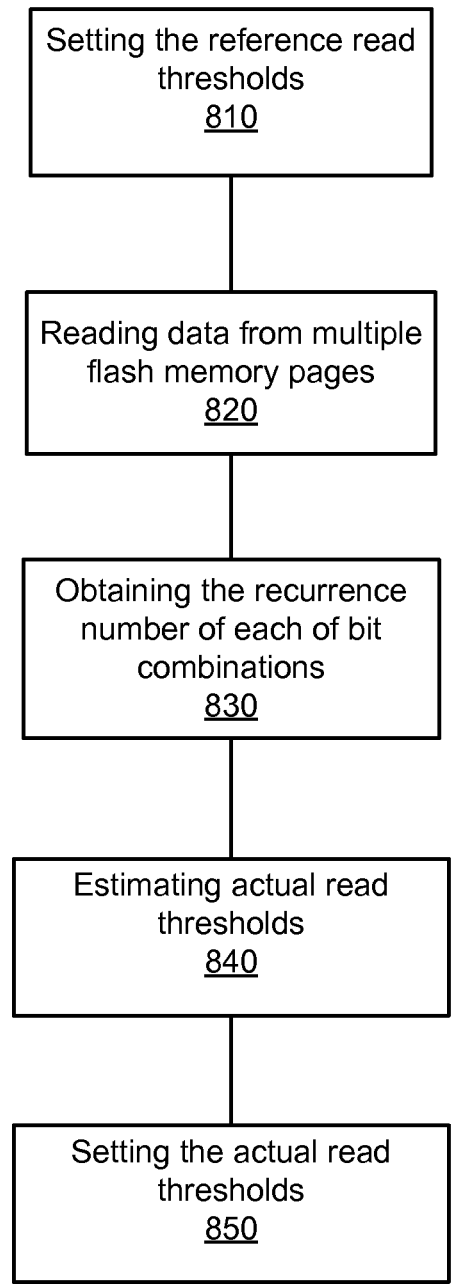
FIG. 8 illustrates a method according to an embodiment of the invention.

FIG. 8 illustrates method 800 according to an embodiment of the invention.

Method 800 may include various stages that are repeated per reference read attempt (out of one or more reference read attempts).

Thus, method 800 may include:
  a. Stage 810 of setting the reference read thresholds to be applied during a reference read attempt to predefined values. This assures that the estimation is based on a consistent measurement set.
  b. Stage 820 of reading data from multiple flash memory pages, associated with a designated row (in a designated block and die). At this stage, a page (or part of it) is read from the row for which it is required to optimize the read thresholds.
  c. Stage 830 of obtaining the recurrence number of each of bit combinations (set of read results associated with a single flash memory cell or a single threshold distribution lobe) of the read results. At this stage the corresponding bits of all read results can be viewed and stage 830 may include counting the number of appearances of each of the bit combinations in the binary representation of the read results. For example, the first combinations may be 000, 001, 010, 011, 100, 101, 110, and 111 in the case of three reference read attempts. For each combination, the first bit may correspond to a read result obtained during a first reference read attempt, the second bit to a read result obtained during the second reference read attempt and the third bit to a read result obtained during the third reference read attempt—all three read results relating to the same flash memory cell while the different reference read attempts differ from each other by the reference read results applied during that reference read attempt.

d. Stage 840 of estimating actual read thresholds based on the recurrence numbers calculated in stage 830.

e. Stage 850 of setting the actual read thresholds according to actual read thresholds calculated in stage 840.

Again, the decision of the reference read threshold and the determination of the estimation function can be done based on database collected offline. Similar linear, polynomial and any other non-linear estimating functions can be applied in this case as well where the input is no longer scalar but a vector (of 8 values, for example).

Multiple Staggered Reference Reads

According to an embodiment of the invention there is provided a method that may modify the reference read threshold to be applied during different reference read attempts between one reference read attempt and the next, depending on the read results.

For example, the first reference read attempts may give some coarse information with regard to the state of the read flash memory cells and then, next reference read attempts may be more accurate in the sense that they involve applying reference read thresholds that are matched to the state of the flash memory cells.

This may involve performing an initial read of an initial group of flash memory cells to obtain initial read results; processing the initial read results by performing at least one out of calculating a distribution of values of the initial read results and counting a number of initial read results of a certain value; and selecting the reference read threshold in response to at least one out of the distribution of values of the initial read results and the number of initial read results of the certain value.

Figure 9:
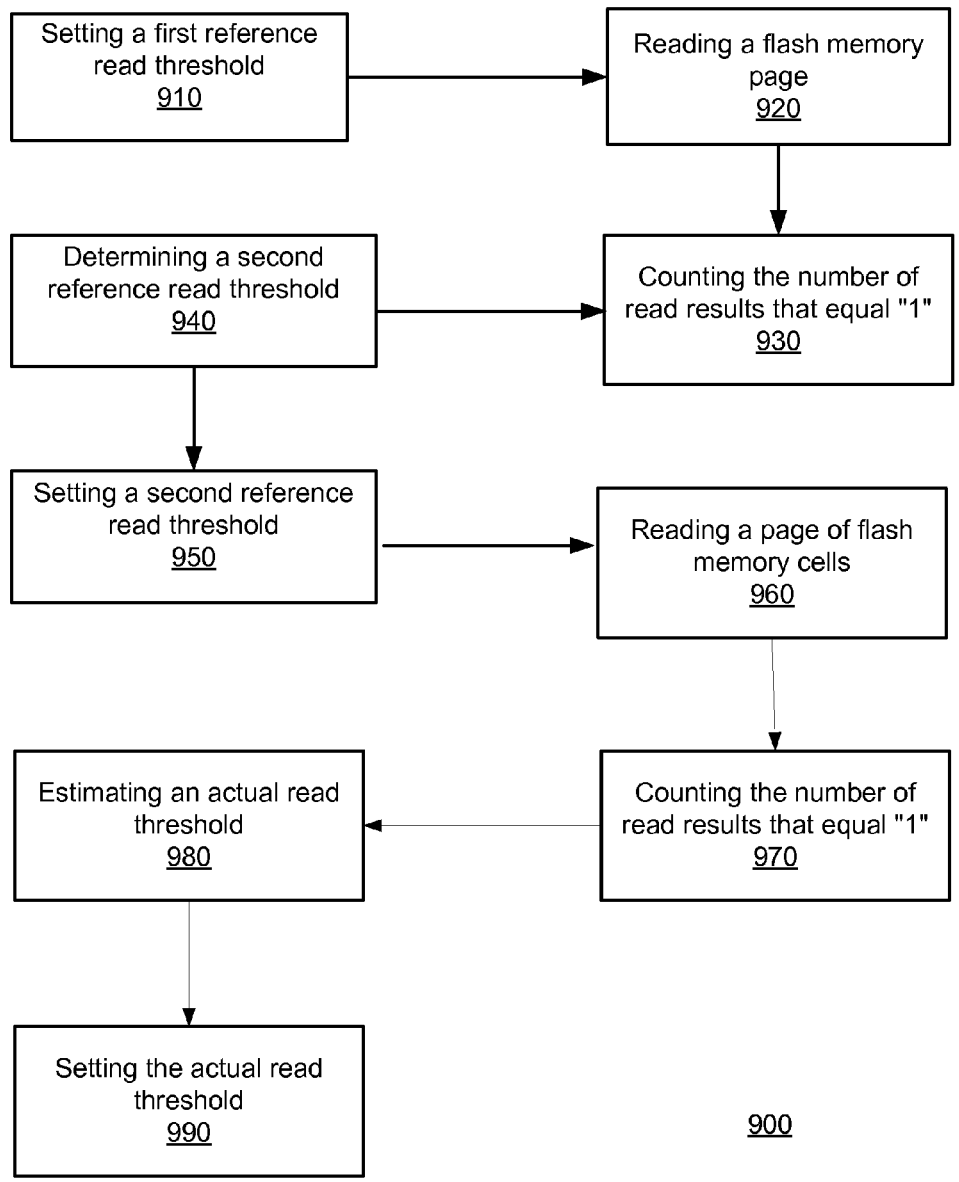
FIG. 9 illustrates a method according to an embodiment of the invention.

FIG. 9 illustrates method 900 according to an embodiment of the invention.

Method 900 may include the following stages:

a. Setting (910) a first reference read threshold—that can be a predefined value which can be always used.

b. Reading a flash memory page (920) to provide read results. These may be regarded as initial read results.

c. Counting (930) the number of read results that equal "1" to provide N1s1.

d. Determining (940) a second reference read threshold, in response to N1s1. N1s1 can provide an indication about the state of the flash memory page, for example—whether the flash memory page has undergone retention and therefore, it may be that the second reference read should be made with a lower reference read threshold.

e. Setting (950) a second reference read threshold.

f. Reading (960) a page of flash memory cells (may be the same page that was read during stage 920 or another flash memory cell) using the second reference read threshold to provide read results.

g. Counting (970), the number of read results (obtained from stage 960) that equal "1" to provide N1s2.

h. Estimating (980) an actual read threshold based on Nisi and N1s2.

i. Setting (990) the actual read threshold according to the value calculated in stage 980.

The above method can be generalized to more than two stages. Furthermore, it may be generalized to the case where each stage includes performing several reference read attempts and prior to performing the next set of reference read attempts it is determined which read thresholds to used based on the outcome of previous reference read attempts.

According to yet another embodiment of the invention the estimating (980) can be responsive not just to the number of ones but to the distribution of values. If multiple bits per cell flash memory cells are read then the estimation may be responsive to the distribution of values of the combination of read values.

The estimating function may be constructed based on a database obtained offline as described in the previous methods.

Online Learning of Estimation Parameters

In the above, all methods relied on an offline database to learn the optimal values for the reference read thresholds and estimating functions. However, the estimating functions and/or the reference read thresholds can be updated over time.

According to an embodiment of the invention such an update can be responsive on the estimated accuracy of the suggested read thresholds generated by any of the mentioned above methods.

For example—after reading real data using actual read thresholds, the method can proceed to determine the number of errors that were found in that read attempt and determine whether the actual read thresholds were accurate or not. Depending on this result, the method may modify the estimating function.

Figure 10:
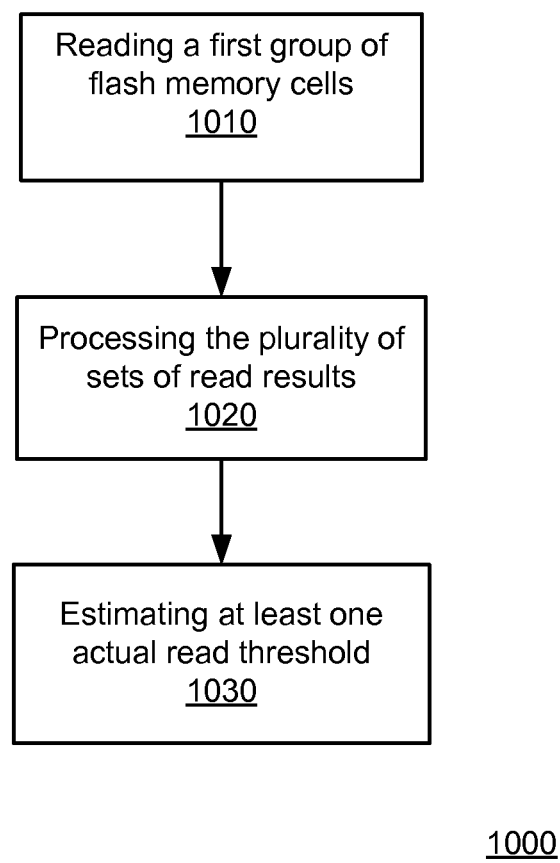
FIG. 10 illustrates a method according to an embodiment of the invention.

FIG. 10 illustrates a method 1000 according to an embodiment of the invention.

FIG. 10 may include the following stages:

a. Reading (1010) a first group of flash memory cells using a plurality of reference read thresholds to obtain a plurality of sets of read results, one set of read results per each flash memory cell of the first group of flash memory cells.

b. Processing (1020) the plurality of sets of read results by performing at least one out of: calculating a distribution of values of the plurality of sets of read results and counting a number of sets of read results of a given value.

c. Estimating (1030) at least one actual read threshold to be used during future read attempts in response to at least one of the distribution of values of the plurality of sets of read results and the number of sets of read results of the given value.

Figure 11:
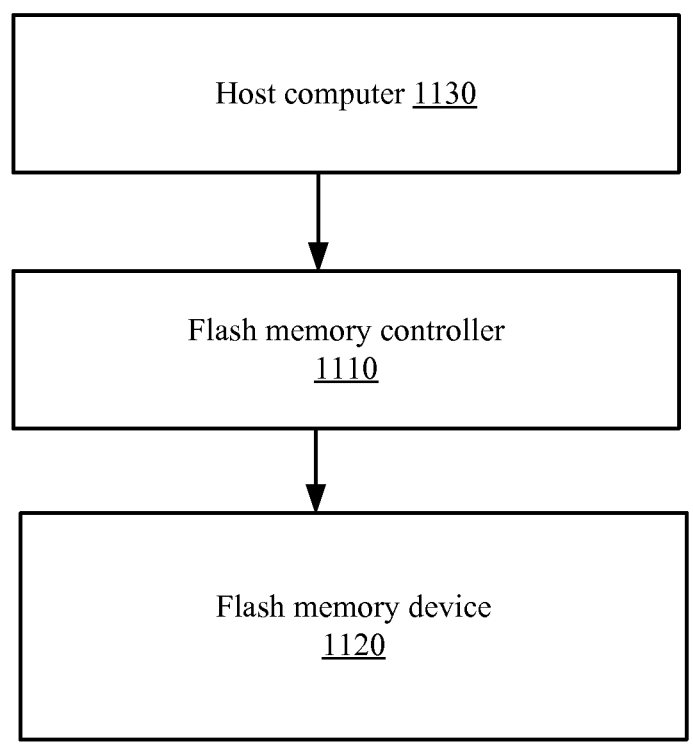
FIG. 11 illustrates a system according to an embodiment of the invention.

FIG. 11 illustrates a system 1100 according to an embodiment of the invention.

System 1100 may execute any of the method illustrated above.

System 1100 is illustrated as including a flash memory controller 1110, a flash memory device 1120 and a host computer 1130 that may be arranged to calculate the reference read thresholds and the suggested read thresholds. The flash memory controller 1100 may perform the read operations (it may include a read circuit, a write circuit, a programming circuit, may include an estimator and processor for processing the read results and estimating at least one actual read threshold respectively. Alternatively—the processor can perform both functions). Alternatively, the flash memory controller 1110 can calculate the reference read thresholds and the suggested read thresholds.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as, "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

Any system, apparatus or device referred to this patent application includes at least one hardware component.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A non-transitory computer readable medium that stores instructions for:
   calculating a reference read threshold in response to information about read threshold voltages of a plurality of flash memory cells and about logical values stored by the plurality of flash memory cells;
   reading a first group of flash memory cells using the reference read threshold to obtain multiple read results;
   processing the multiple read results by performing at least one out of calculating a distribution of values of the multiple read results and counting a number of read results of a certain value;
   estimating at least one actual read threshold to be used during future read attempts in response to at least one out of (i) the number of read results of the certain value and (ii) distribution information about a distribution of values of the read results; and
   reading a second group of flash memory cells using the at least one actual read threshold to provide actual read results.

2. The non-transitory computer readable medium according to claim 1 that stores instructions for processing the multiple read results by calculating the distribution of values of the read results.

3. The non-transitory computer readable medium according to claim 1 that stores instructions for processing the multiple read results by counting the number of read results of the certain value.

4. The non-transitory computer readable medium according to claim 1 that stores instructions for estimating the at least one actual read threshold by applying an estimation function on at least one out of (i) the number of read results of the certain value and (ii) distribution information about the distribution of values of the read results.

5. The non-transitory computer readable medium according to claim 4, wherein the estimation function is a linear function.

6. The non-transitory computer readable medium according to claim 4, wherein the estimation function is a polynomial function.

7. The non-transitory computer readable medium according to claim 4, wherein the estimation function is a minimum means square estimating function.

8. The non-transitory computer readable medium according to claim 4 that stores instructions for updating the estimation function in response to the actual read results.

9. The non-transitory computer readable medium according to claim 1 that stores instructions for:
   performing an initial read of an initial group of flash memory cells to obtain initial read results; and
   selecting the reference read threshold in response to the initial read results.

10. The non-transitory computer readable medium according to claim 9 that stores instructions for evaluating a state of the initial group of flash memory cells in response to the initial read results; wherein the selecting of the reference read threshold is responsive to the state of the initial group of flash memory cells.

11. The non-transitory computer readable medium according to claim 1 that stores instructions for:
   performing an initial read of an initial group of flash memory cells to obtain initial read results;
   processing the initial read results by performing at least one out of calculating a distribution of values of the initial read results and counting a number of initial read results of a certain value; and
   selecting the reference read threshold in response to at least one out of the distribution of values of the initial read results and the number of initial read results of the certain value.

12. The non-transitory computer readable medium according to claim 1 that stores instructions for selecting the reference read threshold based upon a physical characteristic of the first group of memory cells.

13. The non-transitory computer readable medium according to claim 12, wherein the physical characteristic represents a location of the first group of flash memory cells.

14. The non-transitory computer readable medium according to claim 12, wherein the physical characteristic represents a state of the first group of flash memory cells.

15. The non-transitory computer readable medium according to claim 1 that stores instructions for calculating the reference read threshold.

16. The non-transitory computer readable medium according to claim 1 that stores instructions for:
   calculating each reference read threshold out of multiple reference read thresholds in response to the information about read threshold voltages of the plurality of flash memory cells and about logical values stored by the plurality of flash memory cells; wherein the multiple reference read thresholds comprise the reference read thresholds; and
   reading the first group of flash memory cells using multiple reference read thresholds to obtain the multiple read results.

17. A non-transitory computer readable medium that stores instructions for:
   calculating a reference read threshold by: obtaining information about read threshold voltages of a plurality of flash memory cells and about logical values stored by the plurality of flash memory cells; and finding, in response to the information, the reference read threshold that when used during read attempts, minimizes a number of read errors;
   reading a first group of flash memory cells using the reference read threshold to obtain multiple read results;
   processing the multiple read results by performing at least one out of calculating a distribution of values of the multiple read results and counting a number of read results of a certain value;
   estimating at least one actual read threshold to be used during future read attempts in response to at least one out of (i) the number of read results of the certain value and (ii) distribution information about a distribution of values of the read results; and
   reading a second group of flash memory cells using the at least one actual read threshold to provide actual read results.

18. A non-transitory computer readable medium that stores instructions for:
   calculating each reference read threshold out of a plurality of reference read thresholds in response to information about read threshold voltages of a plurality of flash memory cells and about logical values stored by the plurality of flash memory cells;

reading a first group of flash memory cells using the plurality of reference read thresholds to obtain a plurality of sets of read results, one set of read results per each flash memory cell of the first group of flash memory cells;

processing the plurality of sets of read results by performing at least one out of: calculating a distribution of values of the plurality of sets of read results and counting a number of sets of read results of a given value;

estimating at least one actual read threshold to be used during future read attempts in response to at least one of the distribution of values of the plurality of sets of read results and the number of sets of read results of the given value.

19. A non-transitory computer readable medium that stores instructions for: acquiring information about read threshold voltages of a plurality of flash memory cells and about logical values stored by the plurality of flash memory cells; selecting, calculating or finding a reference read threshold per one or more groups of flash memory cells; calculating, based upon the information about read threshold voltages of a plurality of flash memory cells and about logical values stored by the plurality of flash memory cells, and for each group of flash memory cells out of the plurality of flash memory cells, one or more suggested read thresholds; reading the flash memory cells of different groups, using the reference read threshold associated with each group, to provide read results; counting, for each group of flash memory cells of the plurality of flash memory cells, a number of read results of a certain value; and finding, per each suggested read threshold, an estimating function that will map the numbers of read result of the certain value per each group to the suggested read threshold.

20. A system, comprising:
a flash memory controller that is arranged to read a first group of flash memory cells using a reference read threshold to obtain multiple read results;
a host computer that is arranged to:
calculate the reference read threshold in response to information about read threshold voltages of a plurality of flash memory cells and about logical values stored by the plurality of flash memory cells;
process the multiple read results by performing at least one out of calculating a distribution of values of the multiple read results and counting a number of read results of a certain value; and
estimate at least one actual read threshold to be used during future read attempts in response to at least one out of (i) the number of read results of the certain value and (ii) distribution information about a distribution of values of the read results; and
wherein the flash memory controller is also arranged to read a second group of flash memory cells using the at least one actual read threshold to provide actual read results.

21. A system, comprising:
a flash memory controller that is arranged to:
calculate a reference read threshold in response to information about read threshold voltages of a plurality of flash memory cells and about logical values stored by the plurality of flash memory cells;
read a first group of flash memory cells using the reference read threshold to obtain multiple read results;
process the multiple read results by performing at least one out of calculating a distribution of values of the multiple read results and counting a number of read results of a certain value;
estimate at least one actual read threshold to be used during future read attempts in response to at least one out of (i) the number of read results of the certain value and (ii) distribution information about a distribution of values of the read results; and
read a second group of flash memory cells using the at least one actual read threshold to provide actual read results.

22. A system comprising:
a flash memory controller that is arranged to read a first group of flash memory cells using a plurality of reference read thresholds to obtain a plurality of sets of read results, one set of read results per each flash memory cell of the first group of flash memory cells; and
a host computer that is arranged to:
calculate each reference read threshold of the plurality of reference read thresholds in response to information about read threshold voltages of a plurality of flash memory cells and about logical values stored by the plurality of flash memory cells;
process the plurality of sets of read results by performing at least one out of:
calculating a distribution of values of the plurality of sets of read results and counting a number of sets of read results of a given value; and
estimate at least one actual read threshold to be used during future read attempts in response to at least one of the distribution of values of the plurality of sets of read results and the number of sets of read results of the given value.

23. A system comprising:
a flash memory controller that is arranged to calculate each reference read threshold of a plurality of reference read thresholds in response to information about read threshold voltages of a plurality of flash memory cells and about logical values stored by the plurality of flash memory cells; read a first group of flash memory cells using the plurality of reference read thresholds to obtain a plurality of sets of read results, one set of read results per each flash memory cell of the first group of flash memory cells; to process the plurality of sets of read results by performing at least one out of: calculating a distribution of values of the plurality of sets of read results and counting a number of sets of read results of a given value; and estimate at least one actual read threshold to be used during future read attempts in response to at least one of the distribution of values of the plurality of sets of read results and the number of sets of read results of the given value.

24. A system comprising: a flash memory controller that is arranged to acquire information about read threshold voltages of a plurality of flash memory cells and about logical values stored by the plurality of flash memory cells; select, calculate or find a reference read threshold per one or more groups of flash memory cells; calculate, based upon the information about read threshold voltages of a plurality of flash memory cells and about logical values stored by the plurality of flash memory cells, and for each group of flash memory cells out of the plurality of flash memory cells, one or more suggested read thresholds; read the flash memory cells of different groups, using the reference read threshold associated with each group, to provide read results; count, for each group of flash memory cells of the plurality of flash memory cells, a number of read results of a certain value; and find, per each suggested read threshold, an estimating function that will map the numbers of read result of the certain value per each group to the suggested read threshold.

25. A method comprising:
  calculating each reference read threshold of a plurality of reference read thresholds in response to information about read threshold voltages of a plurality of flash memory cells and about logical values stored by the plurality of flash memory cells;
  reading a first group of flash memory cells using the plurality of reference read thresholds to obtain a plurality of sets of read results, one set of read results per each flash memory cell of the first group of flash memory cells;
  processing the plurality of sets of read results by performing at least one out of: calculating a distribution of values of the plurality of sets of read results and counting a number of sets of read results of a given value;
  estimating at least one actual read threshold to be used during future read attempts in response to at least one of the distribution of values of the plurality of sets of read results and the number of sets of read results of the given value.

26. A method comprising: acquiring information about read threshold voltages of a plurality of flash memory cells and about logical values stored by the plurality of flash memory cells; selecting, calculating or finding a reference read threshold per one or more groups of flash memory cells; calculating, based upon the information about read threshold voltages of a plurality of flash memory cells and about logical values stored by the plurality of flash memory cells, and for each group of flash memory cells out of the plurality of flash memory cells, one or more suggested read thresholds; reading the flash memory cells of different groups, using the reference read threshold associated with each group, to provide read results; counting, for each group of flash memory cells of the plurality of flash memory cells, a number of read results of a certain value; and finding, per each suggested read threshold, an estimating function that will map the numbers of read result of the certain value per each group to the suggested read threshold.

27. A method comprising:
  calculating a reference read threshold in response to information about read threshold voltages of a plurality of flash memory cells and about logical values stored by the plurality of flash memory cells;
  reading a first group of flash memory cells using the reference read threshold to obtain multiple read results;
  processing the multiple read results by performing at least one out of calculating a distribution of values of the multiple read results and counting a number of read results of a certain value;
  estimating at least one actual read threshold to be used during future read attempts in response to at least one out of (i) the number of read results of the certain value and (ii) distribution information about a distribution of values of the read results; and
  reading a second group of flash memory cells using the at least one actual read threshold to provide actual read results.

* * * * *